United States Patent
Lin et al.

(10) Patent No.: US 8,310,835 B2
(45) Date of Patent: Nov. 13, 2012

(54) SYSTEMS AND METHODS FOR PROVIDING VIAS THROUGH A MODULAR COMPONENT

(75) Inventors: Gloria Lin, San Francisco, CA (US); Bryson Gardner, Jr., San Francisco, CA (US); Joseph Fisher, Jr., San Jose, CA (US); Dennis Pyper, San Jose, CA (US); Amir Salehi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 84 days.

(21) Appl. No.: 12/769,086

(22) Filed: Apr. 28, 2010

(65) Prior Publication Data

US 2011/0013373 A1    Jan. 20, 2011

Related U.S. Application Data

(60) Provisional application No. 61/225,411, filed on Jul. 14, 2009.

(51) Int. Cl.
*H05K 7/02* (2006.01)
*H01R 43/00* (2006.01)

(52) U.S. Cl. ........ 361/760; 361/790; 361/795; 361/803; 257/723; 257/724; 257/668; 257/686; 257/698; 174/260; 174/263; 174/266; 29/830; 29/831; 29/832; 29/852

(58) Field of Classification Search .......... 361/760–767, 361/732, 756, 773–778, 783–798, 801–803; 174/250–267; 29/825–852; 257/686, 698, 257/E21.5, 693, 777, 723, E23.004, 687, 257/779, 791, 738
See application file for complete search history.

(56) References Cited

U.S. PATENT DOCUMENTS

| | | | | |
|---|---|---|---|---|
| 4,733,461 A * | 3/1988 | Nakano | ........................... | 29/830 |
| 4,956,694 A * | 9/1990 | Eide | ............................ | 257/686 |
| 5,019,946 A * | 5/1991 | Eichelberger et al. | ........ | 361/795 |
| 5,028,986 A * | 7/1991 | Sugano et al. | ................ | 257/668 |
| 5,313,096 A * | 5/1994 | Eide | ............................ | 257/686 |
| 5,376,825 A * | 12/1994 | Tukamoto et al. | ............ | 257/685 |
| 5,613,033 A * | 3/1997 | Swamy et al. | ................ | 361/790 |
| 5,783,870 A * | 7/1998 | Mostafazadeh et al. | ...... | 257/791 |
| 5,857,858 A * | 1/1999 | Gorowitz et al. | .............. | 439/86 |
| 6,137,163 A * | 10/2000 | Kim et al. | .................... | 257/686 |
| 6,313,522 B1 * | 11/2001 | Akram et al. | ................. | 257/686 |
| 6,476,476 B1 * | 11/2002 | Glenn | .......................... | 257/686 |
| 6,501,165 B1 * | 12/2002 | Farnworth et al. | ............ | 257/686 |
| 6,650,007 B2 * | 11/2003 | Moden et al. | ................. | 257/686 |
| 6,717,824 B2 * | 4/2004 | Miyajima et al. | ............. | 361/803 |
| 7,652,362 B2 * | 1/2010 | Jung et al. | .................... | 257/686 |
| 7,667,313 B2 * | 2/2010 | Kawabata et al. | ............ | 257/686 |
| 7,800,918 B2 * | 9/2010 | Saeki | ............................ | 361/803 |
| 7,944,061 B2 * | 5/2011 | Bauer et al. | ................... | 257/787 |

* cited by examiner

*Primary Examiner* — Michail V Datskovskiy

(57) ABSTRACT

This relates to systems and methods for providing one or more vias through a module of an electrical system. For example, in some embodiments, the module can include one or more passive and/or active elements of the electrical system around which a packaging has been plastic molded. The module can be stacked under another component of the electrical system. Vias can then be provided that extend through the module. The vias can include, for example, electrically conductive pathways. In this manner, the vias can provide electrical pathways for coupling the component stacked on top of the module to other entities of an electronic device including the electrical system. For example, the component can be coupled to other entities such as other components, other modules, printed circuit boards, other electrical systems, or to any other suitable entity.

22 Claims, 10 Drawing Sheets

SYSTEMS AND METHODS FOR PROVIDING VIAS THROUGH A MODULAR COMPONENT

CROSS-REFERENCE TO RELATED APPLICATIONS

This application claims the benefit of U.S. Provisional Patent Application No. 61/225,411, filed on Jul. 14, 2009, which is hereby incorporated by reference herein in its entirety.

FIELD OF THE INVENTION

This relates to systems and methods for providing vias. In particular, this relates to systems and methods for providing vias that can operate as electrically conductive "highways" through a modular component.

BACKGROUND OF THE DISCLOSURE

Electrical systems are often created from a variety of components that are coupled together through, for example, a printed circuit board ("PCB"), a substrate, or any other suitable medium. As an exemplary electrical system, an audio system may include an audio jack, audio jack pads (e.g., electrical connectors), one or more passive elements (e.g., resistors, capacitors, inductors, microphone circuitry, or headphone circuitry), one or more active elements (e.g., transistors), and any other suitable microchips or entities that are coupled to a PCB. The PCB may include wiring or other conductive pathways for coupling these entities together. Such an electrical system may be included in any suitable electronic device such as, for example, a cellular phone, a laptop computer, a handheld gaming device, or any other suitable electronic device. As electronic devices become smaller and smaller in size, however, there is a coinciding need to make their associated electrical systems smaller in size.

One of the most recognizable ways of reducing the size of an electrical system can be to achieve an overall reduction in size of the electrical system. However, in some scenarios other beneficial ways of reducing the size can be achieved. For example, an electronic device may have available space in the z-direction, but not in the x and y-directions. Accordingly, in this case an electrical system can be created that utilizes more space in the z-direction while utilizing less space in the x and y-directions. Thus, although the electrical system itself may or may not achieve an overall reduction in volume, the electronic device incorporating this electrical system can achieve a smaller size. However, since the components of an electrical system are often wired together through a PCB board residing in the x-y plane, increasing the size of the electrical system in the z-direction can sometimes result in additional complications or lack of wiring space when wiring these components together.

SUMMARY OF THE DISCLOSURE

This is directed to systems and methods for providing vias through a modular component.

In some embodiments, a system can include one or more components and modules. As used herein, the term "component" can refer to discrete entities that are generally pre-packaged instances such as a processor chip, memory chip, CODEC chip, I/O chip, communication chip, accelerometer, audio jack, audio jack pad (e.g., connector), and the like. Moreover, as used herein, the term "module" or "modular component" refers to discrete components that can be pre-packaged and which can include a via operating as an electrically conductive "highway" through the module.

In some embodiments, modules and/or components can be coupled to a printed circuit board ("PCB"). The PCB can provide wiring or other electrical coupling to couple the modules and components on the PCB board together, thus allowing these coupled modules and components to communicate with one other. In some cases, however, a component can be stacked on top of a module (e.g., stacked on a side of the module that that is not adjacent to the PCB). Since this stacked component is on top of the module and is not coupled to the PCB, this component may be unable to couple to and communicate with the other components and modules of the system. Accordingly, in some embodiments a "via" can be provided through the module that couples the stacked component directly to the PCB. In some embodiments, the via can extend through the module without coupling to and/or interacting with any of the inner element of the module. In this manners, the via can act as "highways" allowing various signals to bypass through module such that the stacked component can couple to the PCB (e.g., and to the other components and modules coupled to the PCB).

In some embodiments, one or more vias can extend through a single module that is coupled to a PCB. One or more components can be stacked on top of the module that can be coupled to the PCB through the one or more vias. In some embodiments, "horizontal" vias can be provided that extend from one side surface of a module to another side surface (e.g., as opposed from extending from a bottom surface of the module that is coupled to the PCB to a top surface of the module). Horizontal vias may, for example, couple two components together that are located on either side of the module. In some embodiments, "bent" vias can be provide that, rather than extending solely in the vertical and/or horizontal direction, bend or curve in shape. This may, for example, aid the via in routing around one or more elements of the module.

In some embodiments, "edge-plated vias" can be provided over the outer surface of a component, module, or other entity of the electrical system. For example, silver paint or another conductive material can be painted, sprayed, plated, or otherwise coupled to the outer packaging of the entity. The edge-plated vias can provide an electrical pathway to electrically coupled two or more entities adjacent to the entity on which the edge-plated vias are painted.

BRIEF DESCRIPTION OF THE DRAWINGS

The above and other advantages of the invention will be apparent upon consideration of the following detailed description, taken in conjunction with accompanying drawings, in which like reference characters refer to like parts throughout, and in which.

DETAILED DESCRIPTION OF THE DISCLOSURE

Figure 1:
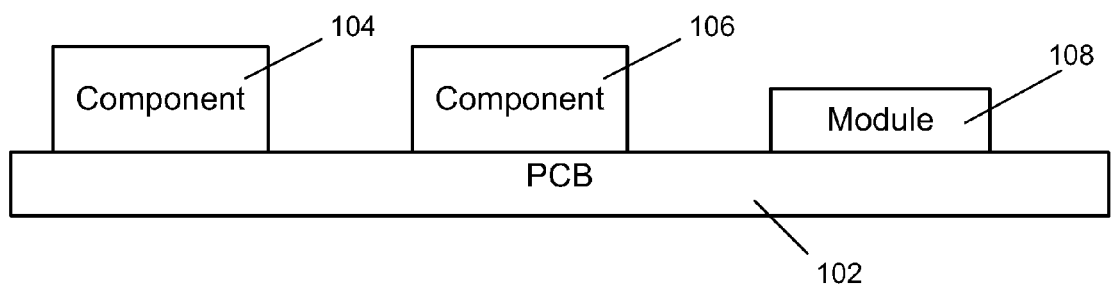
FIGS. 1 and 2 are illustrative electrical systems including a printed circuit board in accordance with some embodiments of the invention.

FIG. 1 shows an illustrative electrical system 100. Electrical system 100 can include any suitable electrical system for use in an electronic device. For example, electrical system 100 can include an audio system, a display system, an input system, or any other suitable system. Electrical system 100 can be used in any suitable electronic device such as, for example, a cellular phone, a personal data assistant ("PDA"), a digital media player (such as an iPod™, made available by Apple Inc. of Cupertino, Calif.), a laptop computer, a desktop computer, a remote control, a handheld gaming device, or any other suitable electronic device.

Electrical system 100 can include one or more components that are electrically coupled together through printed circuit board ("PCB") 102. These components can be discrete entities that are generally pre-packaged instances. In some embodiments, the components can be generic entities which various end-users can integrate into their own electronic systems (e.g., as opposed to an ASIC or other component which is specifically designed for a particular system). For example, the components can include one or more processor chips, memory chips, CODEC chips, I/O chips, communication chips, accelerometers, audio jacks, audio jack pads (e.g., connectors), or any other suitable components. As used herein, when a specific illustration of a component is provided, one skilled in the art could appreciate that the specific illustration is given merely for illustration and not for limitation, and that any other suitable component could alternatively or additionally have been illustrated.

PCB 102 can consist of one or more layers available for wiring, and can be used to electrically couple the components of electrical system 100 together. For example, PCB 102 can be formed with conductive pathways or other wiring to suitably provide electrical connections between component 104 and component 106 of electrical system 100. For example, in some embodiments, component 104 can include an audio jack (e.g., to receive a 3.5 millimeter plug or other suitable audio plug) and component 106 can include an audio jack pad (e.g., to communicate the signals received by the audio jack to the rest of the electrical system). Component 104 and component 106 can then be electrically coupled through PCB 102. Although specific examples of component 104 and component 106 are provided herein, one skilled in the art could appreciate that these components could alternatively include any two or more components that should be electrically coupled one to the other.

PCB 102 can include any suitable type of PCB such as, for example, a flexible printed circuit board ("flex PCB") a rigid printed circuit board, any suitable substrate, or any other suitable type of PCB. Moreover, the components of electrical system 100 can be coupled to PCB 102 and to one another through any suitable method. For example, they may be coupled to one another through a form of Surface Mount Technology, such as a Pin Grid Array ("PGA"), Land Grid Array ("LGA"), or Ball Grid Array ("BGA").

In some embodiments, electrical system 100 can include one or more passive elements. As used herein, a "passive element" can refer to elements such as, for example, a resistor, a capacitor, an inductor, microphone circuitry, headphone circuitry, or any other suitable passive elements. In some embodiments, electrical system 100 can include one or more active elements. As used herein, the term "active element" can refer to elements that can require power such as transistors or other suitable active elements.

In some embodiments, the passive elements of electrical system 100 can be created in a modular package. For example, one or more of the passive elements of electrical system 100 can be included in a module, such as module 108. Although the discussion herein may refer to a module as including passive elements, it should be understood that modules can additionally or alternatively include any active elements suitable for the operation of that module. In particular, as used herein, the term "module" or "modular component" refers to discrete components that can be pre-packaged and which can include a via operating as electrically conductive "highway" through the module. Vias that can extend through modules will be described in greater detail below.

A module can be used, for example, as a building block in various types of electrical systems. As an illustration, module 108 can include one or more of the passive and/or active elements of electrical system 100. Plastic molding, resin, or any other suitable form of molding, may be used to create packaging around these passive elements, thus effectively forming the passive elements into a single, discrete entity. The plastic molding can include any suitable design for coupling the passive elements to one another. For example, in some embodiments the plastic molding can include hollow pathways that are filled with an electrically conductive material, thus forming wiring between the passive elements of module 108. Alternatively, any other suitable molding or process can be used to create packaging for the module.

Figure 2:
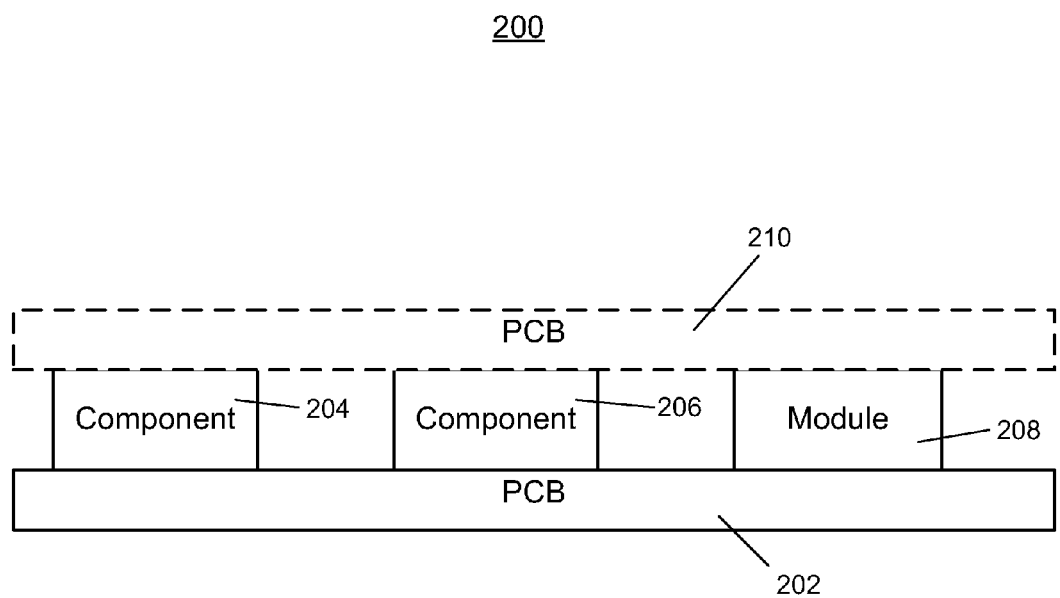

In some embodiments, two or more instances of a PCB can be coupled to differing sides of the components of an electrical system. For example, FIG. 2 shows electrical system 200. Electrical system 200 can include PCB 202, component 204, component 206, and module 208 that can correspond to, for example, PCB 102, component 104, component 106, and module 108 of FIG. 1, respectively. Electrical system 200 can also include optional PCB 210 that can be coupled to the top surface of one or more of component 204, component 206, and module 208. Similar to PCB 102 of FIG. 1, PCB 210 can provide electrical coupling between the components of electrical system 200, and can include any suitable type of printed circuit board such as a rigid printed circuit board, a flexible printed circuit board, or a suitable substrate.

Figure 3:
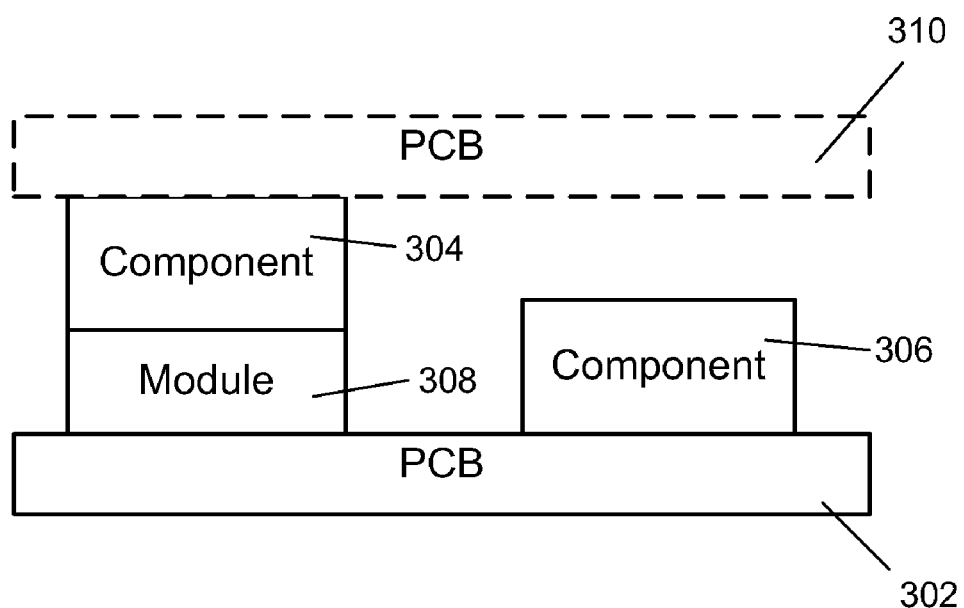
FIG. 3 is an illustrative electrical system including a printed circuit board and stacked components in accordance with some embodiments of the invention.

In some embodiments, one or more of the components of an electrical system can be stacked on top of one another. Stacking components in this manner can reduce the size of an electrical system in the x and y-directions. This, in turn, can allow an electrical system to more optimally fit into an electronic device, thus potentially reducing the overall size of that electronic device. For example, FIG. 3 shows electrical system 300 that can include one or more stacked components. Electrical system 300 can include PCB 302, component 304, component 306, and module 308, that can correspond to, for example, PCB 202, component 204, component 206, module 208, and PCB 210 of FIG. 2, respectively. Electrical system 300 can also include optional PCB 310 that can correspond to, for example, optional PCB 210 of FIG. 2 and can be coupled to the top surfaces of one or more of the components and/or modules of electrical system 300.

Dissimilar to electrical system 200 of FIG. 2, however, component 304 can be stacked on top of module 308. Component 304 can be coupled to PCB 310, and component 306 and module 308 can be coupled to PCB 302. However, due to the stacking of component 304 on top of module 308, component 304 and component 306 may no longer both be coupled to the same PCB. Rather, module 308 may be blocking component 304 from reaching PCB 302, thus preventing the coupling of component 304 to component 306 through PCB 302. Accordingly, in some embodiments, an electrically conductive via can be provided that extends through module 308 to allow component 304 to electrically couple to PCB 302 (e.g., by soldering interconnects of component 304 to the vias, or through any other suitable process). In this manner, the via can further allow component 304 to electrically couple to component 306 through PCB 302.

Figure 4:
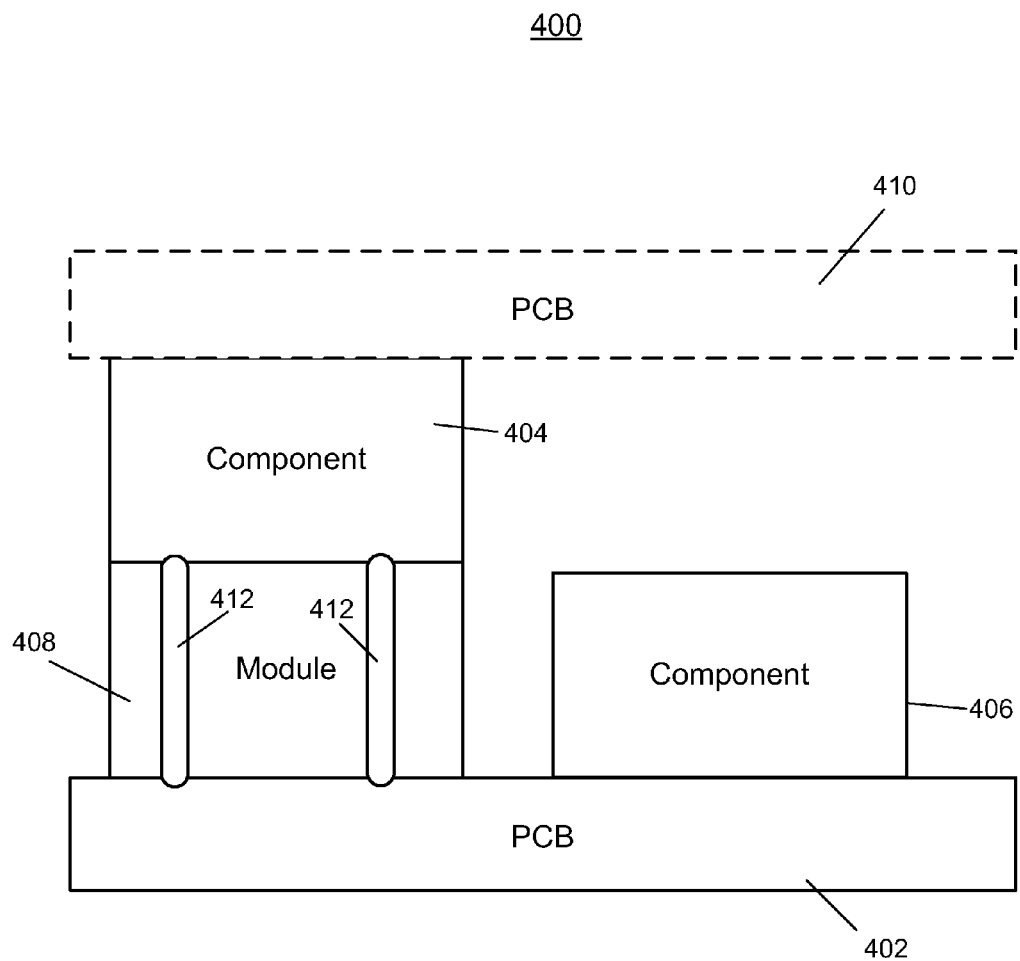
FIGS. 4, 5, 6, and 7 are illustrative electrical systems including vias in accordance with some embodiments of the invention.

FIG. 4 shows electrical system 400 that can include one or more of such vias. Electrical system 400 can include PCB 402, component 404, component 406, module 408, and optional PCB 410 that can correspond to, for example, PCB 302, component 304, component 306, module 308, and optional PCB 310 of FIG. 3, respectively. Module 408 can include one or more instances of via 412 extending through the module. Although two instances of via 412 are illustrated in FIG. 4, one skilled in the art could appreciate that any suitable number of vias could be included extending through module 408.

Via 412 can include any suitable conductive pathway that extends through module 408. For example, in some embodiments, when module 408 is created, a mold can be used that results in one or more hollow pathways extending through module 408. The hollow pathways may then be filled with any suitable conductive material, such as silver, copper, aluminum, solder, or any other suitably conductive material. As another illustration, in some embodiments a hole can be drilled through the module (e.g., by using a laser, mechanical drill, or other suitable tool). The hole can then be filled with a suitable conductive material. In some embodiments, via 412 can pass through module 408 directly without interacting or coupling with any of the passive elements or elements of module 408. In this manner, via 412 can effectively act as an electrically conductive "highway" that allows signals arriving to and/or from component 404 to pass through module 408. For example, the signals can pass through module 408 through the vias without otherwise interacting with and/or electrically coupling with elements of module 408. In this manner, a pathway can be provided that allows stacked components to couple to a PCB board, to other components and/or modules in the electrical system, or to both.

Figure 5:
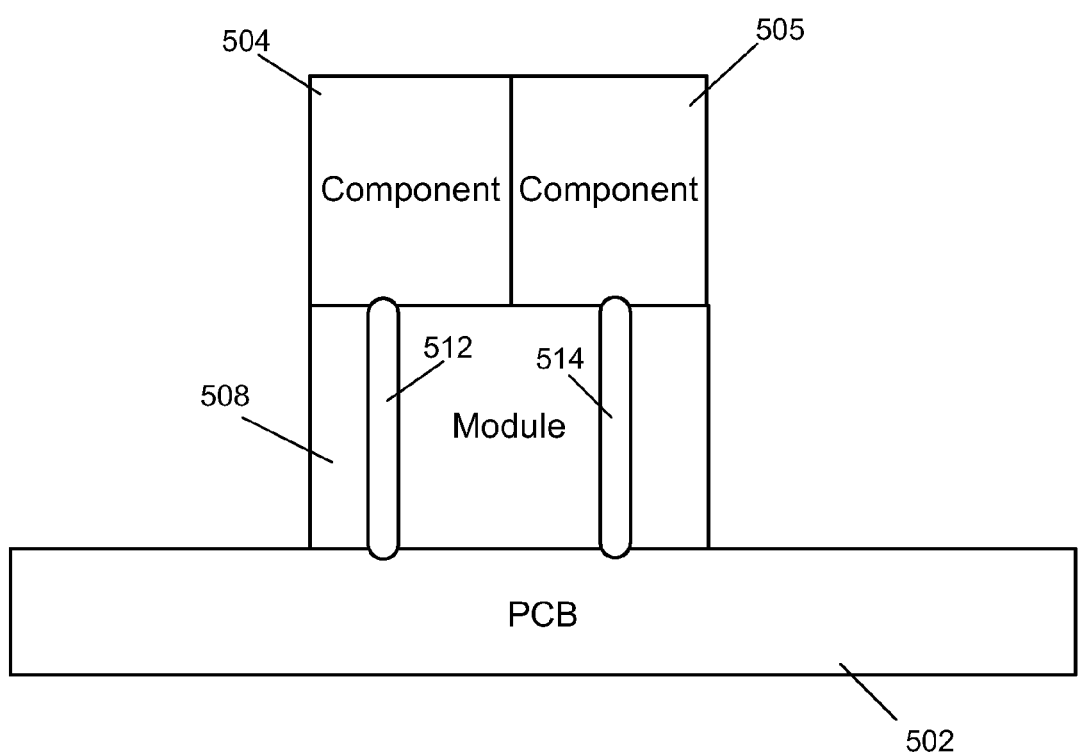

In some embodiments, two or more components can be coupled to vias extending through a module. For example, FIG. 5 shows electrical system 500 that can include component 504 and component 505 that are both stacked on module 508. Module 508 can be coupled to PCB 502 and can include via 512 and via 514 that extend through the module. Component 504 can couple to PCB 502 through via 512 (e.g., and thus can couple to any suitable components coupled to PCB 502). Similarly, component 505 can couple to PCB 502 through via 514. Moreover, one skilled in the art could appreciate that the system illustrated in FIG. 5 could alternatively included three or more components that are coupled to PCB 502 through vias extending through module 508.

Figure 6:
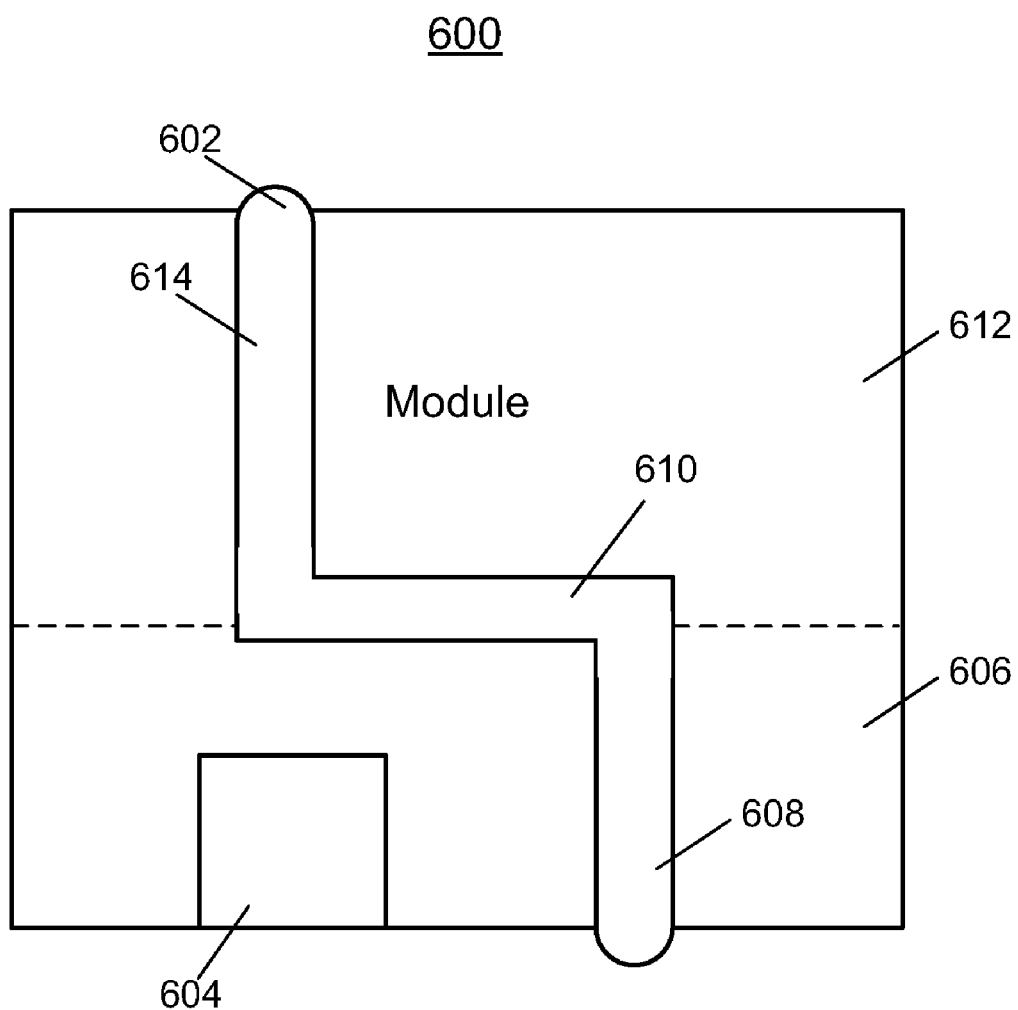

In some embodiments, rather than extending straight through a module, vias can be provided that are "bent" in shape. For example, FIG. 6 shows module 600 that can include one or more instances of bent via 602. Bent via 602 may, for example, allow the via to avoid one or more of the elements (e.g., passive elements, active elements, and the like) of module 600. For example, as illustrated in FIG. 6, the bent shape of bent via 602 can allow the via to route around passive element 604.

Bent via 602 can be created through any suitable process. For example, as one illustration, first portion 606 of module 600 can be created from a mold that forms vertical portion 608 of bent via 602. Such a mold may form hollow pathways extending through portion 606, which may then be filled with any suitable conductive material (e.g., silver, copper, aluminum, and the like) to form vertical portion 608. Horizontal portion 610 of bent via 602 can then be formed on top of first portion 606 of module 600 through any suitable process (e.g., by printing conductive material in a desired pattern on top of first portion 606 or other suitable process). Second portion 612 of module 600 can then be created from a second mold, where this second mold forms vertical portion 614 of bent via 602.

Figure 7:
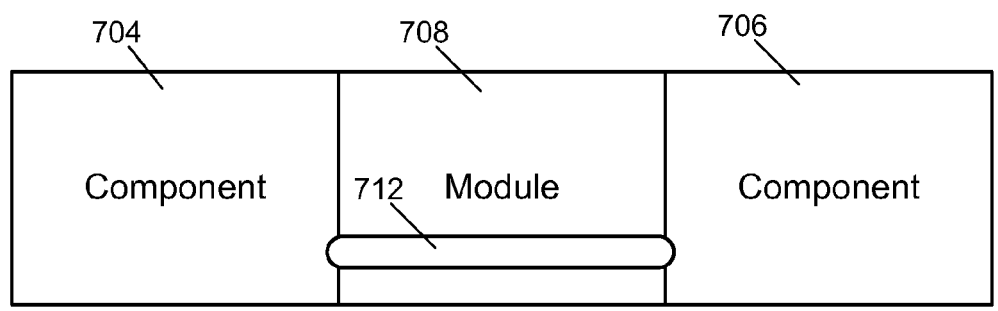

In some embodiments, in addition to providing a pathway to couple vertically stacked components, vias can be provided that couple horizontally positioned elements. For example, FIG. 7 shows electrical system 700 that can include module 708 including one or more instances of horizontal via 712. Horizontal via 712 can allow two or more components that are horizontally positioned (e.g., in the x-y plane) to be electrically coupled through module 708. For example, horizontal via 712 can electrically couple component 704 to component 706. Alternatively or additionally, horizontal via 712 can couple component 704 to a suitable component of a PCB. Moreover, in any of the systems described above, one skilled in the art could appreciate that a via can be utilized to not only couple a component to a PCB, but can alternatively or additionally couple a component to another component, couple a PCB to another PCB, or any combination of the above. Moreover, a combination of horizontal and vertical vias could be utilized. For example, a bent via could be used to couple a component stacked on top of a particular module to a component (e.g., component 404 of FIG. 4) to a component that is located to the side of that module (e.g., component 704 of FIG. 7).

Figure 8:
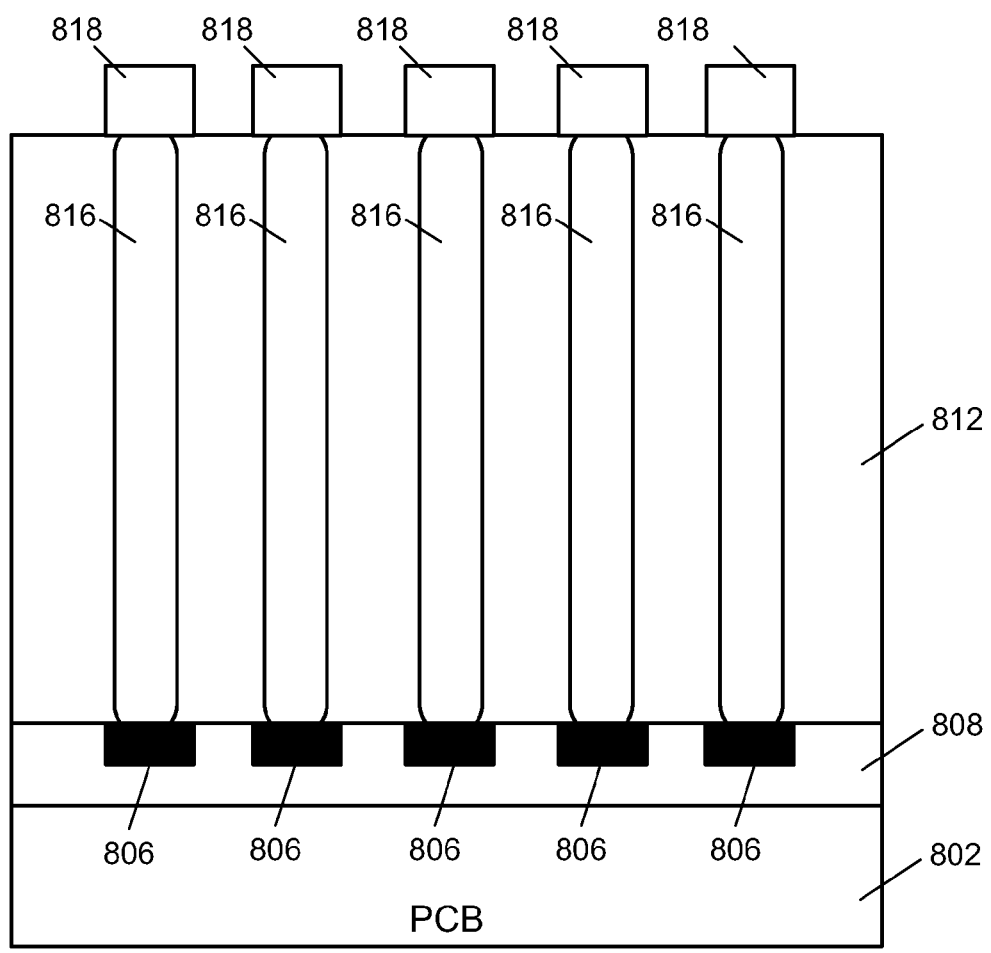
FIG. 8 is illustrative stacked module in accordance with some embodiments of the invention.

FIG. 8 shows an illustrative side view of a portion of system 800 that can include stacked components and vias. For example, system 800 can illustrate a specific type of exemplary electrical system, such as an audio system. In some embodiments, an audio system can include an audio jack that is coupled to a PCB. Such an audio jack can couple to and receive audio signals from, for example, an audio plug such as a 2.5 millimeter TS audio plug, a 3.5 millimeter TRS audio plug, or any other suitable audio plug.

In an audio system, the audio jack can then be coupled to one or more instances of an audio jack pad through the PCB. For example, as illustrated by FIG. 8, audio system 800 can include audio jack pads 806 in PCB 802. In this manner, the audio signals received from an audio plug coupled to the audio jack can be transmitted through the PCB to the audio jack pads (e.g., and then transmitted to the rest of audio system and/or to an electronic device including the audio system). In some embodiments, an instance of each audio jack pad can be provided for each signal received through the audio jack. For example, FIG. 8 illustrates five instances of audio jack pad 806. This can correspond to, for example, five signals that are received through an audio jack (e.g., ground, power, left audio signal, right audio signal, and microphone). Audio jack pads 806 can function as electrical contacts, thus allowing another entity of an electronic device (e.g., another component, module, electrical system, PCB, or other suitable entity) to couple to the audio jack and receive the audio signals.

In some embodiments, the particular pattern in which the audio jack pads of an audio system are arranged in the PCB can be referred to as its "footprint." For example, the five instances of audio jack pad 806 are illustrated in FIG. 8 as being arranged in the particular pattern of footprint 808.

As illustrated in FIG. 8, module 812 has been stacked on top of footprint 808 (e.g., where footprint 808 includes the particular pattern of audio jack pads 806 of audio system 800). Module 812 can include, for example, one or more passive elements and/or active elements of audio system 800. As an illustration, module 812 can include headphone circuitry, microphone circuitry, or any other suitable circuitry for aiding in the operation of audio system 800.

Accordingly, since module 812 is on top of and "blocking" footprint 808, other entities of an electronic device including audio system 800 may be unable to couple to audio jack pads 806 (e.g., and thus may be unable to receive audio signal received by an audio plug coupled to audio system 800). For example, in a general system without module 812 blocking footprint 808, another entity of the audio system (e.g., component, module, electrical system, PCB, or other suitable entity) may include a complimentary footprint of electrical pins, thus allowing this entity be placed "on top of" and couple to audio jack pads 806 to receive the audio signals from the audio jack. However, as module 812 is now blocking such an entity from coupling to audio pads 806, module 812 can include one or more instances of via 816 that extend through it. In some embodiments, vias 816 can extend through module 812 without coupling to and/or interacting with any of the element of module 812. In this manner, vias 816 can act as "highways" allowing various signals to bypass through module 812.

Each instance of via 816 can couple to an audio jack pad 806 on one end of via 816 and to an audio jack pad 818 on the other end of via 816. In some embodiments, vias 816 and audio jack pads 818 can be arranged in the same pattern as footprint 808. In this manner, the same entity (e.g., with a single complimentary footprint) could be used to couple to either audio jack pads 818 of FIG. 8 or to the audio jacks of an audio system in which the footprint is not blocked by a module. This can allow for more flexibility and cheaper options in the design of an electronic device, as the same entity can be used in both a system utilizing stacked components (e.g., audio system 800 of FIG. 8) and in a system that does not utilize stacked components.

In some embodiments, one or more "edge-plated vias" can be provided to electrically couple various components of an electrical system together. For example, a conductive material can be physically coupled to the outside packaging of a component, module, or other suitable entity of an electrical system to form the edge-plated via. As an illustration, a conductive material such as silver paint or any other suitably conductive material can be painted, sprayed, or plated onto the outside packaging. The edge-plated via can then electrically couple two or more components that are positioned adjacent to the entity over which the edge plated vias is painted. In this manner, the edge-plated vias can make use of existing structures within the electrical system to form interconnects for that system. Moreover, by using edge-plated vias, PCB space can be efficiently saved (e.g., since the connections formed by the edge-plated vias may no longer need to be routed through the PCB), which can provide more flexibility in the design of the electrical system. This, in turn, can provide for more efficient usage of space which can result in a smaller electrical system and/or electronic device.

Figure 9:
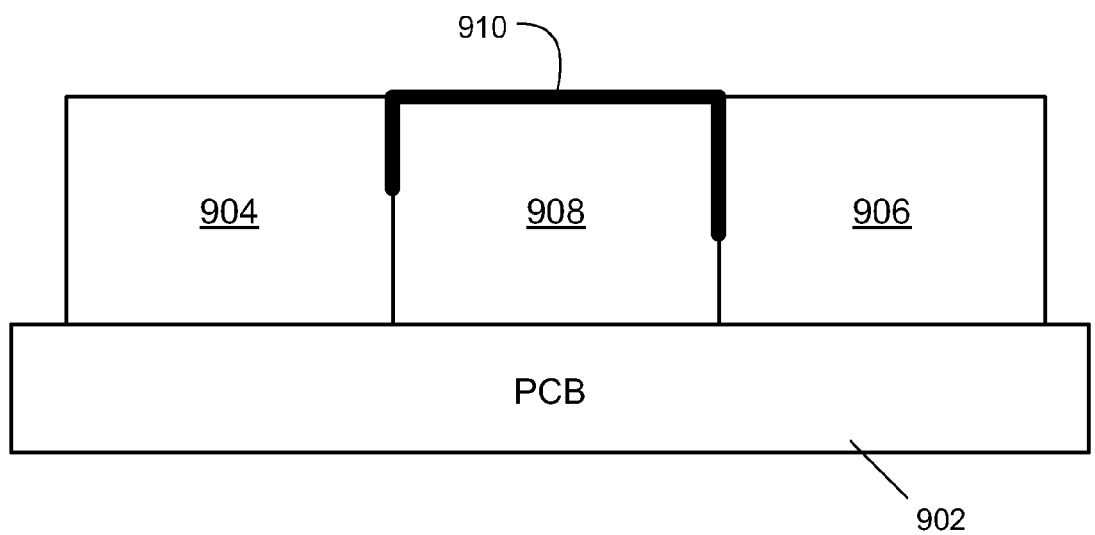
FIG. 9 is illustrative edge-plated via in accordance with some embodiments of the invention.

As an illustration, FIG. 9 shows system 900 that can include edge-plated via 910. Edge-plated via 910 can be painted, sprayed, plated, or otherwise coupled to the outside packaging of entity 908. Edge-plated via 910 can then be used to couple entity 904 to entity 906. For example, one end of edge-plated via 910 could couple to a pin interconnect of entity 904, and the other end of edge-plated via 910 can couple to a pin interconnect of entity 906. In this manner, edge-plated via 910 can be used to couple two or more non-adjacent entities of system 900, without requiring wiring through PCB 902 or requiring other additional structures. Rather, edge-plated via 910 can make use of the already existent structures within system 900 to provide various interconnects within the system.

In some embodiments, edge-plated via 910 can cross over entity 908 without coupling with any of the inner elements of the entity (e.g., can operate as a "highway" electrically bypassing entity 908). However, alternatively or additionally, in some embodiments edge-plated via 910 can couple to entity 908 (e.g., by coupling to a pin interconnect of entity 908), thereby providing a connection between entity 908 and other entities of system 900.

Figure 10:
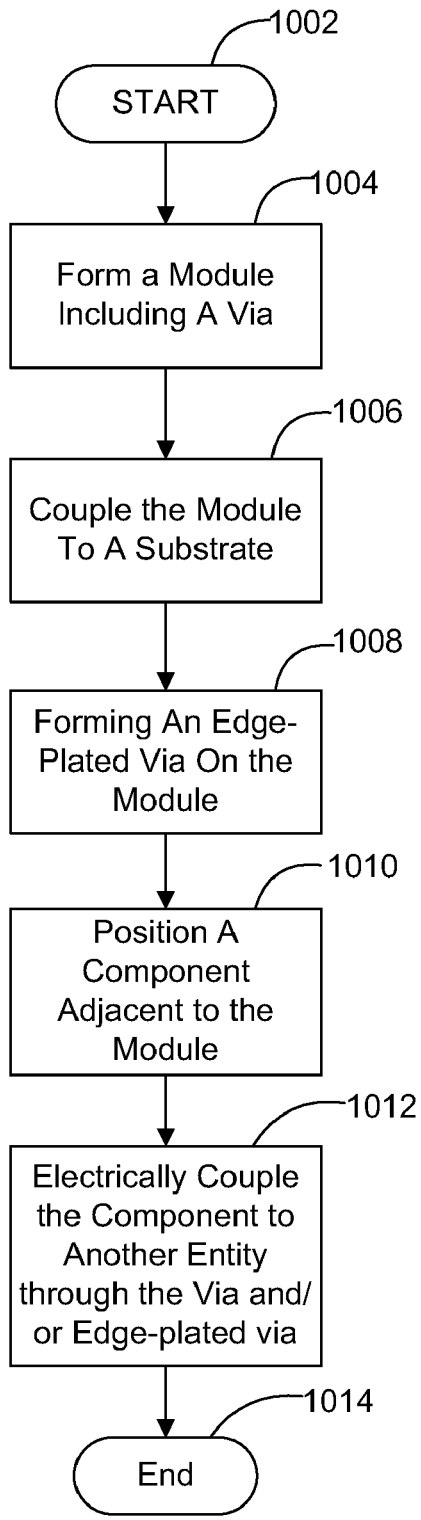
FIG. 10 is illustrative process for providing vias through a modular component in accordance with some embodiments of the invention.

FIG. 10 shows process 1000 for providing various system interconnects such as vias through a modular component and such as edge-plated vias. Process 1000 can begin at step 1002. At step 1004, a module can be formed that includes at least one via. As one example, the module can be formed from a mold that results in one or more holes extending through the module. As another example, a laser, mechanical drill, or other tool can be used to drill a hole through the module. The hole can then be filled with a conductive material (e.g., copper, silver, and the like). In some embodiments, the via can be "bent" in shape or can otherwise curve and turn within the module. In some embodiments, the via can travel vertically and/or horizontally through the module. In particular, the via can start or end at either a bottom surface, top surface, and/or any of the side surfaces of the module.

At step 1006, the module can be coupled to a substrate. For example, the module can be coupled to a substrate such as a PCB, flex PCB, or other suitable substrate. Any suitable surface of the module can be coupled to the substrate, such as the bottom surface of the module.

At step 1008, at least one edge-plated via can be formed on an outer surface of the module. For example, a silver paint or other conductive material can be painted, sprayed, plated, or otherwise physically coupled to the outer surface of the packaging of the module. In some embodiments, the edge-plated via may not electrically couple to any of the inner element of the module, and instead may only be physically coupled to the outer surface of the module. In this manner, the edge-plated via can provide an electrically conductive "highway" that bypasses over the module without electrically coupling with the module.

At step 1000, a component can be positioned adjacent to the module. For example, the component can be stacked on top of the module or positioned adjacent to a side surface of the module.

At step 1012, the component can then be electrically coupled to another entity (e.g., other than the module or the component itself) through the via and/or the edge-plated via. For example, the component can be electrically coupled to another component, another module, the PCB (e.g., the substrate of step 1006), an electrical system, or other suitable entity. As an illustration, the component can be stacked on top of the module, and the via can electrically couple the component to the PCB through the module. As another illustration, the via and/or edge-plated via can be used to couple a component adjacent to one side of the module to an entity that is adjacent to another side of the module. Process 1000 can then end at step 1014.

The process discussed above is intended to be illustrative and not limiting. Persons skilled in the art could appreciate that steps of the process discussed herein can be omitted, modified, combined, or rearranged, and any additional steps can be performed without departing from the scope of the invention. For example, in some embodiments, a step such as step 1008 can omitted, such that vias are only provided through the module.

Various configurations described herein may be combined without departing from the invention. The above described embodiments of the invention are presented for purposes of illustration and not of limitation. The invention also can take many forms other than those explicitly described herein. Accordingly, it is emphasized that the invention is not limited to the explicitly disclosed methods, systems, and apparatuses, but is intended to include variations to and modifications thereof which are within the spirit of this disclosure.

What is claimed is:

1. An electrical system comprising:
    a substrate;
    a module comprising a first surface and a second surface, wherein the first surface is coupled to the substrate;
    a first component coupled to the substrate;
    a second component positioned adjacent to the second surface of the module; and
    at least one via extending through the module, wherein the at least one via is operable to electrically couple the first component to the second component, and wherein the at least one via comprises at least one bend, such that the at least one via does not extend in a straight line through the module.

2. The electrical system of claim 1, wherein the at least one via is operable to electrically couple the first component to the second component by electrically coupling the second component to the substrate.

3. The electrical system of claim 1, wherein the at least one via does not electrically couple to the module.

4. The electrical system of claim 1, wherein:
    the first surface comprises a bottom surface of the module; and
    the second surface comprises a top surface of the module, such that the second component is stacked on top of the module.

5. The electrical system of claim 4, wherein the at least one via comprises:
    a first vertical portion formed in a first mold of the module;
    a first horizontal portion formed on top of the first mold of the module; and
    a second vertical portion formed in a second mold of the module.

6. An electrical system comprising:
    a substrate;
    a module comprising a first surface and a second surface, wherein the first surface is coupled to the substrate;
    a first component coupled to the substrate;
    a second component positioned adjacent to the second surface of the module; and
    at least one via extending through the module, wherein the at least one via is operable to electrically couple the first component to the second component, and wherein:
    the first component is positioned adjacent to a first side surface of the module; and
    the second surface, which is positioned adjacent to the second component, comprises a second side surface of the module, wherein the second side surface is a different side than the first side surface.

7. The electrical system of claim 6, wherein the at least one via extends horizontally through the module from the first side surface to the second side surface.

8. The electrical system of claim 4, further comprising a second substrate coupled to, and stacked on top of, the second component.

9. An electrical system comprising:
    a substrate;
    a module comprising a first surface and a second surface, wherein the first surface is coupled to the substrate;
    a first component coupled to the substrate;
    a second component positioned adjacent to the second surface of the module; and
    at least one via extending through the module, wherein the at least one via is operable to electrically couple the first component to the second component, and wherein:
    the first component is positioned adjacent to a first side surface of the module;
    the second surface, which is positioned adjacent to the second component, comprises a top surface of the module; and
    the via electrically couples the first component to the second component by extending from the first side surface to the top surface.

10. An electrical system comprising:
    a substrate;
    a module comprising a first surface and a second surface, wherein the first surface is coupled to the substrate;
    a first component coupled to the substrate;
    a second component positioned adjacent to the second surface of the module;
    at least one via extending through the module, wherein the at least one via is operable to electrically couple the first component to the second component;
    a third component positioned adjacent to the second surface of the module; and
    a second via extending through the module, wherein the second via is operable to electrically couple the first component to the third component.

11. The electrical system of claim 1, wherein the electrical system comprises an audio system.

12. A system comprising:
    a first component, wherein the first component is encased in a packaging;
    a first entity positioned adjacent to an outer surface of the packaging of the component;
    a second entity positioned adjacent to the outer surface of the packaging of the component; and
    at least one edge-plated via physically coupled to the outer surface, wherein the edge-plated via is operable to electrically couple the first entity to the second entity.

13. The system of claim 12, wherein the first and second entity comprises at least one of a microelectronic chip, a component, a module, an electrical system, and a printed circuit board.

14. The system of claim 12, wherein the edge-plated via comprises a conductive material that is physically coupled by at least one of spraying, painting, and plating the conductive material to the outer surface of the packaging.

15. The system of claim 14, wherein the conductive material comprises a silver paint.

16. The system of claim 12, wherein the edge-plated via does not electrically couple to the component.

17. The system of claim 12, wherein the edge-plated via comprises:
    a first end; and
    a second end, and wherein the edge-plated via is operable to electrically couple the first entity to the second entity by electrically coupling the first end to a first interconnect pin of the first entity and electrically coupling the second end to a second interconnect pin of the second entity.

18. A method comprising:

coupling a module of an electrical system to a substrate;

forming an edge-plated via on the module;

physically coupling a first component of the electrical system adjacent to the module; and forming an electrically conductive pathway from the first component to a second component of the electrical system by means of the edge-plated via.

19. The method of claim 18, wherein the at least one electrically-conductive via does not electrically couple with the module.

20. The method of claim 18, wherein physically coupling the component of the electrical system to the module comprises:

stacking the first component on top of the module.

21. The method of claim 18, wherein the edge-plated via does not electrically couple with the module.

22. The method of claim 18, wherein the edge-plated via electrically couples with the module.

* * * * *